United States Patent [19]

Doran et al.

[11] Patent Number: 4,568,861
[45] Date of Patent: Feb. 4, 1986

[54] METHOD AND APPARATUS FOR CONTROLLING ALIGNMENT AND BRIGHTNESS OF AN ELECTRON BEAM

[75] Inventors: Samuel K. Doran, Wappingers Falls; Donald F. Haire, Verbank; Ralph R. Trotter, Hopewell Junction, all of N.Y.

[73] Assignee: International Business Machines Corporation, Armonk, N.Y.

[21] Appl. No.: 507,638

[22] Filed: Jun. 27, 1983

[51] Int. Cl.[4] ............................................. H01J 29/52
[52] U.S. Cl. .................................... 315/379; 250/397
[58] Field of Search ................ 315/378, 379, 383, 384, 315/385, 386, 387, 388, 389, 391, 398, 307, 10; 313/425; 250/396 ML, 397, 398, 492 B, 306, 307, 310, 311; 324/118

[56] References Cited

U.S. PATENT DOCUMENTS 3,894,271  7/1975  Pfeiffer et al. ..................... 315/384
4,000,440 12/1978  Hall et al. ........................... 315/383

Primary Examiner—Theodore M. Blum
Assistant Examiner—David C. Cain
Attorney, Agent, or Firm—Sughrue, Mion, Zinn, Macpeak & Seas

[57] ABSTRACT

An electron beam is aligned with the center of an aperture in a plate in the path of the beam by cyclically scanning the beam across the aperture through equal distances on opposite sides of an initial beam location, measuring the beam current that flows through the aperture when the beam is on opposite sides of the initial location, which opposite sides correspond to adjacent half cycles of the scan, determining the difference in beam currents flowing in adjacent half cycles, and deflecting the beam in a direction toward the center of the aperture until there is reached a condition wherein the difference in currents is zero, which condition indicates that the beam is aligned with the center of the aperture. The currents may be measured by converting them to signals having a frequency proportional to the current, counting the signal cycles during each half cycle, and then subtracting the count for one half cycle from that of an adjacent half cycle. The amplitude of the scan is large enough such that the beam strikes the opposite edges of the aperture at the extreme limits of each scan. The scan frequency is preferably that of the power line frequency to eliminate noise problems. The total current flowing through the aperture during a complete scan cycle is also sensed and used to regulate the brightness of the electron beam.

14 Claims, 6 Drawing Figures

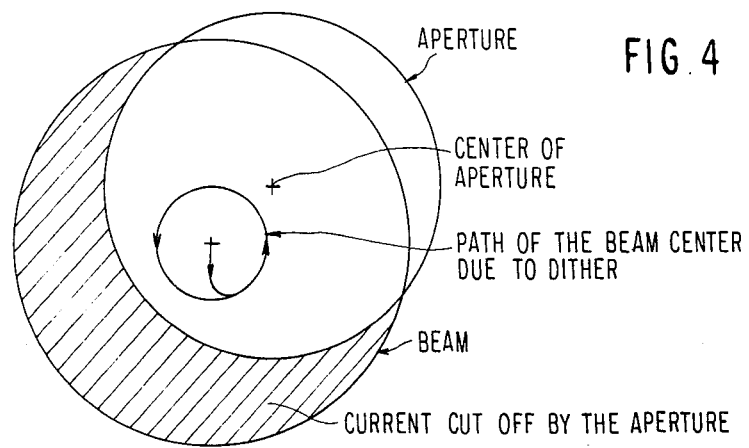
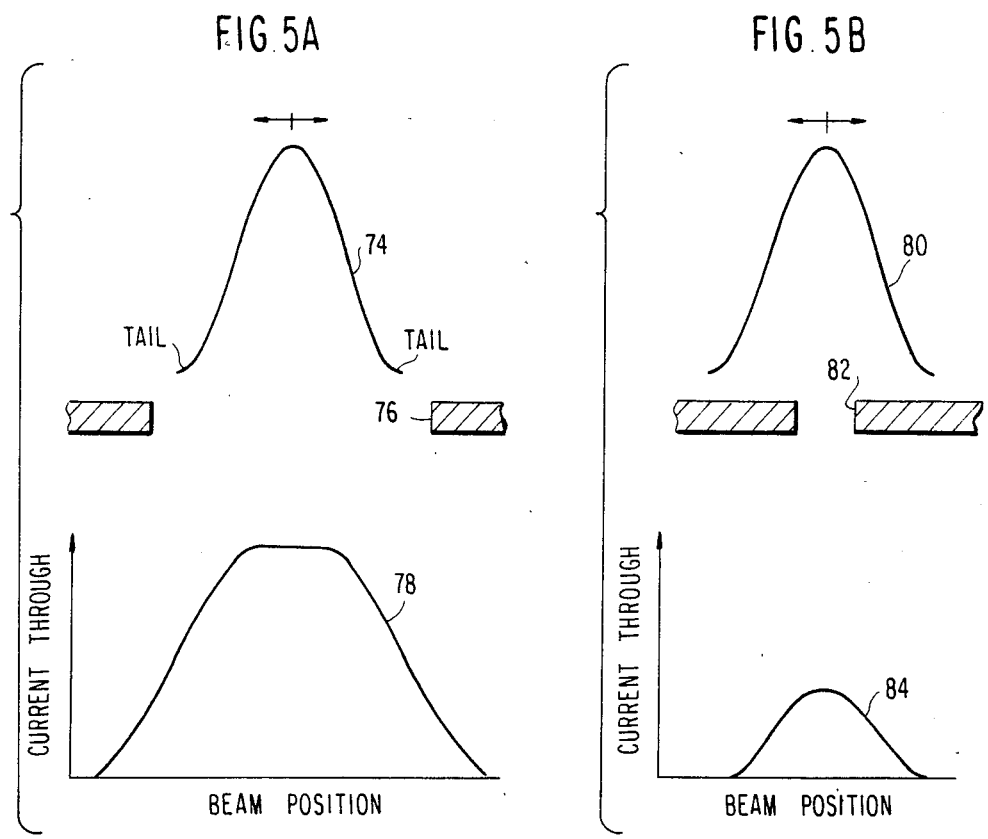

METHOD AND APPARATUS FOR CONTROLLING ALIGNMENT AND BRIGHTNESS OF AN ELECTRON BEAM

TECHNICAL FIELD

This invention relates generally to a method and apparatus for controlling an electron beam and, more particularly, to a method and apparatus for correcting the alignment and brightness of an electron beam used for writing patterns on a target, such as a semiconductor wafer.

PRIOR ART

U.S. Pat. No. 3,644,700 and 3,900,736, both assigned to the same assignee as the assignee of this application, dislose method and apparatus for controlling a square-shaped beam. The beam is deflected throughout a writing field on a semiconductor wafer to write a desired pattern on the wafer.

For the beam to be applied at the desired positions on the wafer, the beam must be properly aligned. However, instability of the beam can be caused by mechanical, thermal or electrostatic influences, and this instability is manifested by lateral drifting of the electron beam. Thus, it is desirable continually to monitor and correct the beam alignment.

U.S. Pat. No. 3,894,271 discloses a method and apparatus for correcting the beam alignment during blanking of the beam by sensing the amount of beam current passing through a special alignment aperture in a blanking plate located in the path of the beam; an up-down counter counts up and down for each increase and decrease, respectively, of sensed current during each alignment correction cycle, and the stored count is converted to an analog correction voltage which is applied to an alignment yoke to correct the beam alignment in the X and Y directions. U.S. Pat. No. 4,000,440 discloses a similar method and apparatus for alternately correcting both the alignment and the brightness of the electron beam. Both of these patents are also assigned to the assignee of this application. IBM Technical Disclosure Bulletin, Vol. 19, No. 2, July 1976, pages 464-465 discloses a beam alignment system in which the alignment is carried out by double deflection of the beam before the beam enters a square aperture in a first plate; the beam is blanked by deflecting it from the central aperture in a second, following plate which acts as a current collector, thereby eliminating the need for a separate offset alignment aperture as disclosed in U.S. Pat. No. 3,894,271.

SUMMARY OF THE INVENTION

The present invention is an improved electron beam control method and apparatus in which the electron beam is quickly and accurately aligned while the beam is blanked. A special alignment aperture in a blanking plate is not necessarily required. Furthermore, the brightness of the beam can be controlled simultaneously with the correction of the beam alignment. The beam is dithered across an aperture of a beam shaping plate in the path of the beam. In order to eliminate the difficulties encountered by prior art methods and apparatus in attempting to correct the alignment of a beam whose size may be smaller or larger than the aperture used for alignment, in the present invention the magnitude of the beam dither is always chosen to be large enough so that the beam intersects the edge of the alignment aperture at both limits of the dither. The dithering signal is preferably synchronized with the power line frequency to cancel out any power frequency noise on the beam.

BRIEF DESCRIPTION OF THE DRAWING

FIG. 4 is a view illustrating the manner in which the electron beam is moved when it is corrected in accordance with the timing diagram of FIG. 3.

FIGS. 5A and 5B are views illustrating the relative insensitivities of prior art beam correction systems when the beam width is smaller and larger, respectively, than the alignment aperture.

DETAILED DESCRIPTION OF THE PREFERRED EMBODIMENTS OF THE INVENTION

Figure 1:
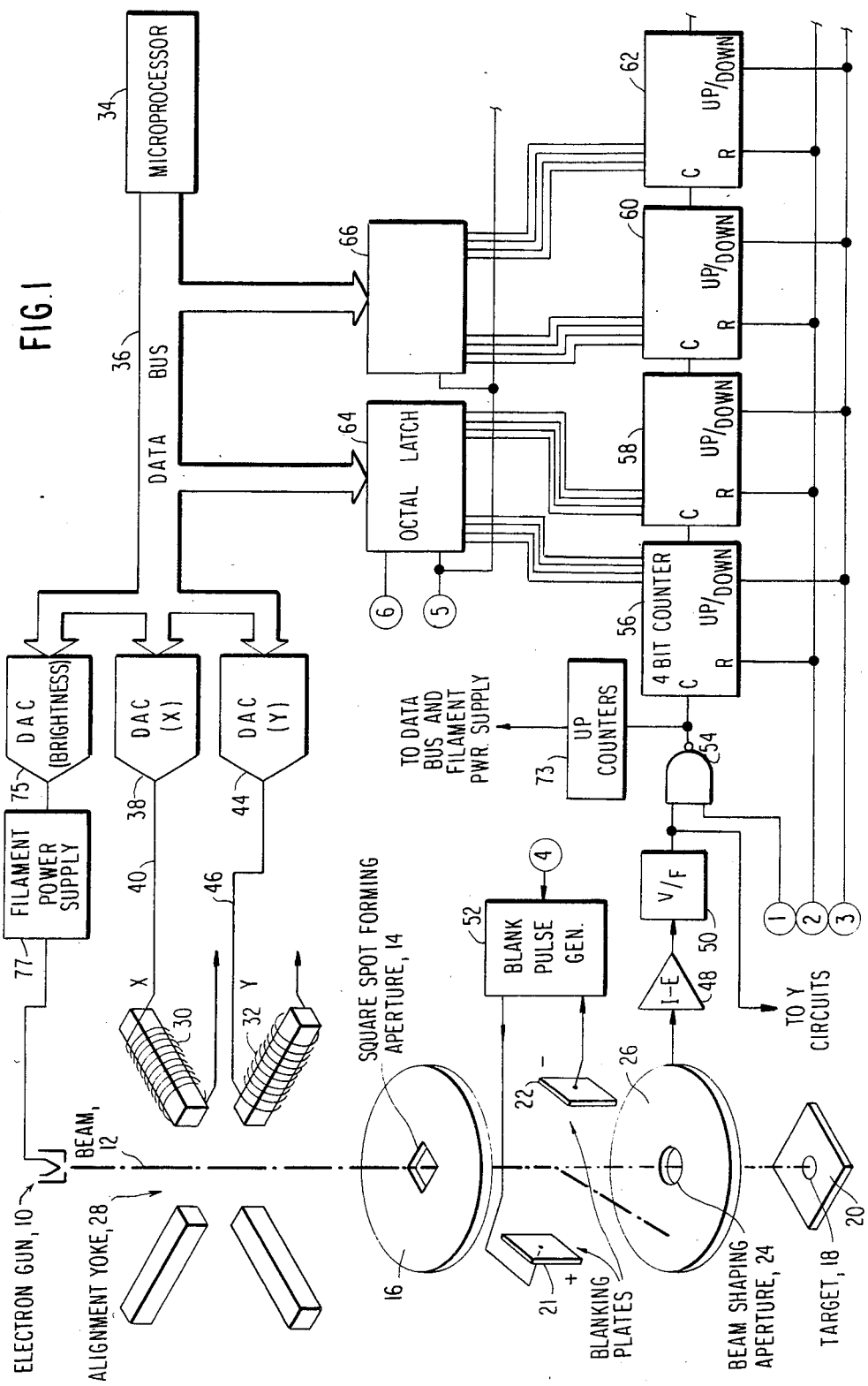
FIG. 1 is a schematic view showing the apparatus of the present invention incorporated in a system for controlling the alignment and brightness of an electron beam.

In FIG. 1, electron gun 10 produces an electron beam 12 in the well-known manner. The square beam is passed through a square spot-shaping aperture 14 in a plate 16 to form various square or rectangular shapes of the beam that have a minimum size equal to the minimum line width of the pattern that is to be written on a target 18, such as one of a plurality of chips on a semiconductor wafer mounted on a table 20 which is movable to different positions to place other chips in the target area. The beam then passes between a pair of blanking plates 21 and 22, and then through a beam-shaping aperture 24 in another plate 26. Although not shown in the drawing, below plate 26 are deflection coils for effecting the actual writing of the beam on the target. Lenses, other electrostatic deflection plates, other apertures and other alignment sections may also be placed in the part of the electron beam for focusing and shaping the beam. During movement of the table 20 to place another chip in the target area, the beam is blanked by applying a blank pulse across the blanking plates 21, 22 in order to deflect the beam from the central aperture 24 onto the plate 26 so that no writing occurs at this time on the wafer. It is during this blanking of the beam that the present invention dithers the beam across aperture 14 and corrects the alignment and current of the beam.

The electron beam 12 also passes through an alignment yoke 28 located between the electron gun 10 and the plate 16. The yoke consists of a pair of X-direction deflection coils 30 and a pair of Y-direction deflection coils 32. It is to these deflection coils that the dithering signal and the respective X and Y direct current beam alignment currents are applied. The dithering and the alignment correction of the electron beam occurs while the beam is blanked, that is, while the beam is deflected by the blanking plates 21, 22 onto plate 26 and off the aperture 24. Thus, plate 26 collects the beam current which passes through the square aperture 14 in the plate 16 during a beam correction cycle. The collected currents are fed to circuits which form digital beam alignment and brightness control servos.

Figure 2:
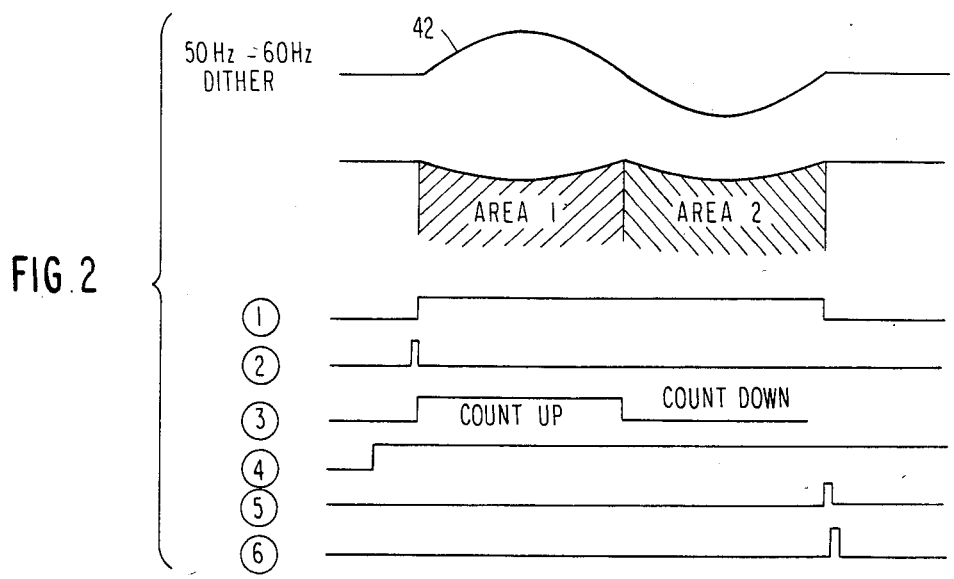
FIG. 2 is a timing diagram illustrating the dithering signal, the electron beam current sensed during adjacent half cycles of the dithering signal, and the essential control signals required for operating the apparatus of FIG. 1.

FIG. 2 illustrates the dithering signal and the control pulses required for the alignment and brightness correction cycle. A microprocessor 34, such as an Intel 8085, applies to a bidirectional data bus 36 a digital dithering signal which is synchronized with the available power line frequency, typically 50 or 60 Hz, i.e., the dither frequency is f/n, where f is the line frequency, and n is an integer. The microprocessor can easily accomplish said synchronization by sensing the zero crossings of the power line waveform and transmitting the digital dithering signal at the appropriate time to achieve synchronization thereof with the power line frequency. The digital dithering signal is transmitted simultaneously with a digital signal representing a D.C. voltage corresponding to any required correction of the beam alignment. The digital signals are applied via the data bus 36 to an X-direction digital-to-analog-converter (DAC) 38 which outputs via a line 40 to the X deflection coils 30 an analog current consisting of a periodic dither signal 42 superimposed upon a D.C. current corresponding to the required alignment correction current. In the same or a subsequent correction cycle, the dither signal and a corresponding Y-direction alignment correction digital signal are transmitted to a Y-direction digital-to-analog converter (DAC) 44 which applies a corresponding analog current via a line 46 to the Y-direction beam deflecting coils 32. Since the circuits for correcting the beam alignment in both the X and Y directions are the same, only the X correction will be described in detail.

Even though the dithering signal 42 may be any periodic waveform in which adjacent half cycles are equal, it is preferred that the dithering signal 42 be an analog 60 Hz sinusoidal wave form synchronized with the power line frequency. The dithering signal could also be a digital approximation of such an analog signal.

During a beam correction cycle when the beam 10 is blanked as illustrated in FIG. 1, the current collected by plate 26 is fed to an operational amplifier 48 which converts the current to a corresponding voltage which, in turn, is fed to a voltage-to-frequency (V/F) converter 50 operating in the 100 KHz range. Blanking of the beam is effected by applying a blank control pulse 4 to a blank pulse generator 52 which applies an appropriate blank pulse across the blanking plates 21, 22. The output of the V/F converter 50 is fed to one input of a NAND gate 54 which is enabled at its other input by a correction cycle control pulse 1. The frequency of the signal at the output of gate 54 is counted by a string of 4-bit up/down counters 56, 58, 60 and 62 which are reset prior to the start of the dither by the reset control pulse 2. The number of counters depends on the measurement accuracy which is required. Thus, during the positive half cycle, for example, of the dither, the up/down control signal 3 is up, whereby the counters count up during the positive half cycle of the dither signal 42. Thus, at the end of the first half cycle, i.e., when the up/down signal goes down, the counters store a count in which the most significant digit is a sign bit. For the purpose of explanation, we can assume that the beam is at the approximate center of the square aperture. The dither signal 42 then dithers the beam so that the beam is alternately scanned from the initial point in the X direction back and forth at least far enough to intersect opposite edges of the aperture. On the negative half cycle of the dither signal 42, the up/down control signal 3 is down so that the counters now count down from the positive count which had been stored in the preceding half cycle. Thus, at the end of one dither cycle, the counters store a count and a sign indicating the magnitude and direction of the alignment correction which is required to center the beam 10 on the square aperture 14. When the beam is aligned, the stored count is zero. At the end of one dither cycle, a control pulse 5 transfers the count in the counters to corresponding octal latches 64, 66 etc., and then the control pulse 6 transfers the count from the latches to the data bus 36 and thus, to the microprocessor 34 which decides whether a correction is required and, if so, transmits to the DAC 38 a digital alignment correction signal as previously described. Correction of the beam alignment in the Y direction is accomplished in the same manner by the use of the Y deflection coils 32, a digital alignment servo coupled to the output of the V/F converter 50, and the DAC 44.

The counters 56, 58, 60, 62 etc. effectively average Area 1 and Area 2 under the respective half cycles of the dither signal 42 to determine the magnitude and direction of the beam alignment correction which is required in order to center the beam on the aperture 14. Thus, an immediate and almost total correction of the beam alignment is achieved, as compared to the slow, incremental correction produced by prior art methods and apparatus. Furthermore, the averaging is accomplished by counting several hundred pulses for each half cycle of the dither signal. More specifically, assuming a 60 Hz dither signal and a 100 KHz operating frequency of the V/F converter 50, the up/down counters will count over 800 pulses for each half cycle of the dither signal, after which the counts are algebraically summed (i.e. Area 2 is subtracted from Area 1) to produce the alignment correction current. Furthermore, in view of this large number of counts per half cycle, if there should be a void in the electron beam or if one pulse is obliterated by noise, the effect on the average of over 800 pulses is miniscule as compared to the prior art incremental alignment correction systems wherein a missed or erroneous pulse would have a very large effect on the alignment correction signal sent to the DAC. For example, 10 volts on the input of V/F converter 50 would be converted to a frequency of 100 KHz, and 5 volts to 50 KHz.

In the case where the beam is not well centered, as long as some beam current passes through the aperture during some of the dither excursion, this serve can move the beam to the center position. This case would represent a gross misalignment and would take more than one servo operation or correction cycle. If the beam totally misses the aperture, even including the dither, which might happen in a first time alignment, the microprocessor could go into a raster mode where the beam alignment coils would move the beam in raster fashion until some beam current fell through the aperture.

Figure 3:
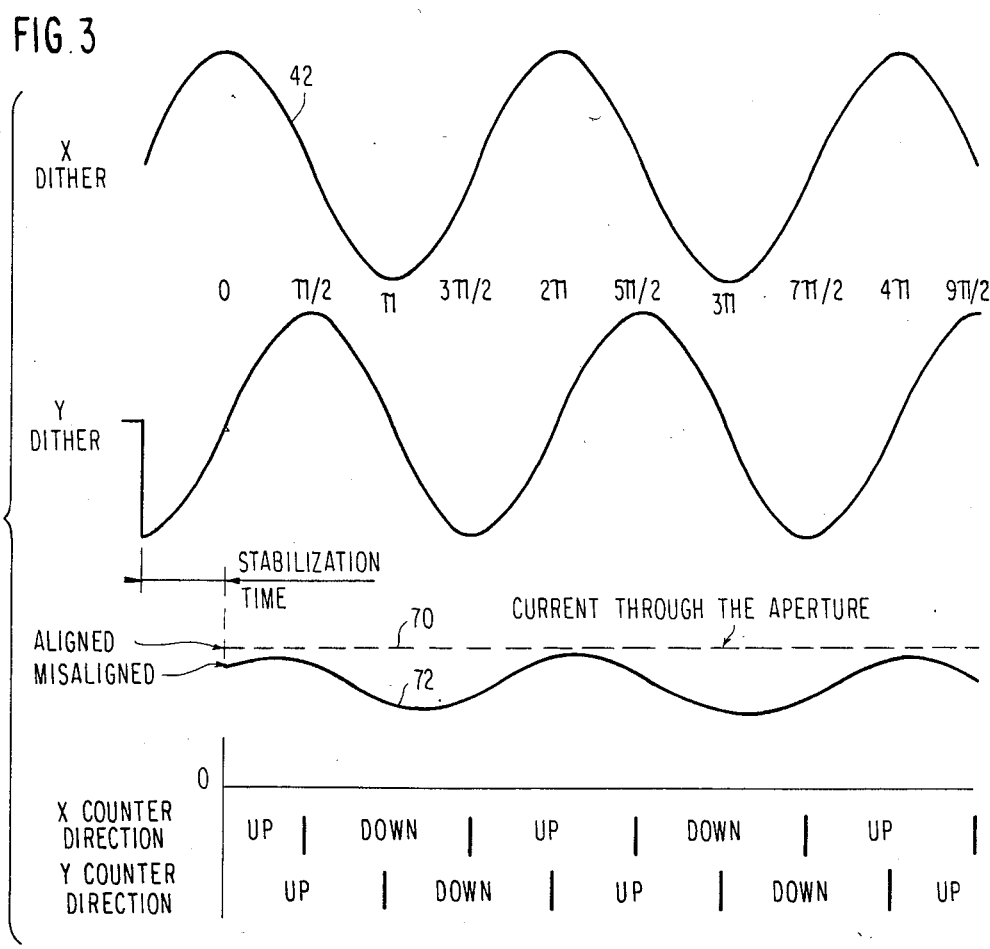
FIG. 3 is a timing diagram in which the beam correction can be accomplished in the same correction cycle, rather than in different cycles.

Even though there has been described a system wherein the beam alignment is separately corrected in the X and Y directions, the alignment may also be corrected in both directions in the same cycle as illustrated in FIG. 3. The X dither signal 42 and a Y dither signal 68 are merely displaced in phase by 90° and applied simultaneously to the X and Y deflection coil pairs 30 and 32, respectively. If it is assumed that the magnitude of the dither signal is such that, when the beam is centered in the aperture, the beam is dithered just to reach the opposite edges of the aperture, then the current passing through the aperture and collected by the plate 26 is constant as indicated by the dashed line 70 in FIG. 3. If the beam is misaligned relative to the center of the aperture, then the current passing through the aperture varies as shown by line 72 in FIG. 3. FIG. 4 illustrates, as an example, the manner in which the center of a circular beam moves relative to the center of an aperture when X and Y dither signals are applied simultaneously as illustrated in FIG. 3.

The numbers in the counters after a few cycles of dither will be sufficient to tell the microprocessor how to move the D.C. alignment of the beam better to center it through the aperture. Such a circular approach is preferred if there is a significant amount of hysteresis in the magnetic deflection yoke 28. Such hysteresis would cause a delay between the dither and the actual beam positions, but this delay can be measured and compensated by appropriately delaying the changes of counting directions of the counters.

The brightness of the electron beam can be controlled simultaneously with the correction of the beam alignment. A brightness servo has been disclosed in at least some of the above-cited prior art. Suffice it to say that a series of up counters 73 is connected to the output of the gate 54 so as to count in one direction the pulses from V/F converter 50 so that these counters, at the end of one dither cycle, store a count proportional to the total beam current collected by plate 26. In the manner just described with respect to the beam alignment correction, the count in the counter 73 is transferred via the data bus 36 and the microprocessor 34 to a brightness DAC 75 which outputs an analog D.C. voltage to the filament power supply 77 which varies the power supplied to the filament in accordance with the difference between the output of DAC 75 and a reference voltage corresponding to the desired brightness of the beam. Software in microprocessor 34 and an address bus directs the digital signals to the appropriate DAC's in a conventional time-multiplexing manner.

Thus, there have been disclosed an improved method and apparatus for controlling both the alignment and brightness of an electron beam. The shape of the beam, the shape of the aperture, and the rotation of the beam with respect to the aperture are irrelevant to this invention. Furthermore, the synchronization of the dither signal with the local power line frequency is useful if there are some components of noise on the beam's position due to power line coupling. The power line deflection noise may change the amplitude of the dither, but the final result is not affected by such amplitude changes which are effectively canceled out. In the preferred embodiment described above, the current measured is that of the beam which passed through the square aperture 14 and which was blanked onto the plate 26 containing the round aperture 24. Of course one could also measure the current that is cut off by the square aperture 14; however, the microprocessor 34 would then have to interpret the signs in the counters differently; the geometry considerations of the beam and apertures will determine which approach is preferable.

The V/F converter 50 and the string of counters, such as 56, 58 etc., are convenient means of measuring the area under the aperture current curve by effectively taking thousands of samples in a few milliseconds; however, other methods of sampling and averaging the data could be used. In the preferred embodiment, the V/F converter and counters effectively take thousands of data samples, average them together, and subtract those taken during negative dither from those taken during positive dither. Such averaging and subtracting makes it possible to detect very small differences of beam alignment in a large background noise. As mentioned previously, a spurious noise spike would contribute only one more count error in the present invention; however, by contrast, in the prior art systems which take one "snapshot" current measurement, a spurious noise spike which occurred during the "snapshot" would produce a very significant error in the measured current and possibly produce an erroneous signal for correcting the beam alignment.

Furthermore, and as previously mentioned, the prior art alignment servos have experienced problems in overcoming errors caused by dead bands. FIGS. 5A and 5B illustrate two such problems. In FIG. 5A, curve 74 represents the profile of the current density of an electron beam passing through an aperture 76 which is larger than the beam. Curve 78 is a plot of the current passing through the aperture as a function of the lateral position of the beam. The objective of an alignment servo is to keep the beam centered over the aperture; however, in FIG. 5A, there is a considerable dead band where the beam must be moved laterally some distance before a tail of the beam current strikes the edge of the aperture. Thus, the prior art incremental servo, which makes several small moves and tests, will have to move the beam through several increments before a decrease in current through the aperture is detected. By contrast, in the present invention, the amplitude of the dither is chosen large enough so that the tails of the beam always strike the sides of the aperture, whereby the center of the aperture is immediately determined.

In FIG. 5B, curve 80 represents the profile of the current density of the electron beam passing through an aperture 82 which is smaller than the beam, and curve 84 is a plot of the current through the aperture as a function of the lateral position of the beam. The increment-and-test type of alignment servo performs better for the situation of FIG. 5B than for that of FIG. 5A, but in the region of best alignment there is an area where the change in beam current is very insensitive to small changes in position. Such a small change in a noisy background can cause errors in the alignment servo. By contrast, the present invention uses a dither having an amplitude that is large enough to move the beam out to a position where the current through the aperture vs. position is steeper, so that a more accurate and repeatable determination of the best alignment position can be made.

Having thus described our invention, what we claim as new, and desire to secure by Letters Patent is:

1. In a method of controlling an electron beam passing from an electron beam source through an initial point of a first aperture in a first plate, the improvement comprising the steps of:
  cyclically scanning the beam across the aperture equal distances from, and in opposite directions along a first path through, the initial point;
  detecting the difference in beam currents flowing through the aperture during adjacent half cycles of a scan cycle; and
  aligning the beam with the center of the aperture by deflecting the beam from the initial point a distance corresponding to said difference in beam currents.

2. The improvement as defined in claim 1 and further comprising cyclically scanning the beam along a second path orthogonal to said first path, and then repeating said detecting and aligning steps.

3. The improvement as defined in claim 1, and wherein said detecting step comprises:
   converting the beam current flowing during each half cycle to a corresponding count;
   storing the counts; and
   subtracting the stored count for one half cycle from that for an adjacent half cycle; and
   wherein said aligning step comprises deflecting the beam a distance corresponding to the differences of said counts.

4. The improvement as defined in claim 1 wherein said scanning step includes choosing the scan amplitude such that the beam always strikes the edges of the aperture at both extremes of the scan.

5. The improvement as defined in claim 1 and further comprising choosing the cyclical frequency of the scan to be in the range of 50 to 60 Hz.

6. The improvement as defined in claim 1, wherein the beam passes through a second aperture in a second plate located downstream of said first plate, and further comprising:
   first blanking the beam by deflecting it away from said second aperture and onto said second plate; and
   wherein said detecting step comprises detecting the difference in beam currents collected by said second plate.

7. The improvement as defined in claim 1 and further comprising:
   detecting the total beam current flowing through the aperture during both half cycles of the scan cycle; and
   adjusting the beam brightness in accordance with the detected total beam current.

8. In an apparatus for controlling an electron beam passing from an electron beam source through an initial point of a first aperture in a first plate, the improvement comprising:
   means for cyclically scanning the beam across the aperture equal distances from, and in opposite directions along a first path through, the initial point;
   means for detecting the difference in beam currents flowing through the aperture during adjacent half cycles of a scan cycle; and
   beam-aligning means for deflecting the beam from the initial point a distance corresponding to said difference in beam currents to align the beam with the center of said first aperture.

9. The improvement as defined in claim 8 and further comprising means for cyclically scanning the beam along a second path orthogonal to said first path;
   second means for detecting the difference in beam currents flowing through the aperture during adjacent half cycles of a scan cycle; and
   second beam-aligning means for deflecting the beam from the initial point a distance corresponding to said difference in beam currents to align the beam with the center of said first aperture.

10. The improvement as defined in claim 8 further comprising:
    converting means for converting the beam current flowing through the aperture in each half cycle to a signal having a frequency proportional to the beam current;
    counting means for counting the number of cycles of said signal which occur during each half cycle;
    means for storing the count for each half cycle; beam-deflecting means disposed between said electron beam source and said first plate; and
    means, responsive to the difference in the stored counts for adjacent half cycles, for applying to said beam-deflecting means a deflection signal of a magnitude and polarity necessary to deflect the beam so that the beam is aligned with the center of said first aperture.

11. The improvement as defined in claim 8 wherein the amplitude of the scan is such that the beam always strikes the edges of the aperture at both extremes of the scan.

12. The improvement as defined in claim 8 wherein the frequency of the scan is in the range of 50 to 60 Hz.

13. The improvement as defined in claim 8, wherein the beam passes through a second aperture in a second plate located downstream of said first plate, and further comprising:
    blanking means for blanking the beam by deflecting it away from said second aperture and onto said second plate; and
    wherein said detecting means comprises means for detecting the difference in beam currents collected by said second plate during said adjacent half cycles.

14. The improvement as defined in claim 8 further comprising:
    means for detecting the total beam current flowing through said first aperture during both half cycles of a scan cycle; and
    means for adjusting the beam brightness in accordance with the detected total beam current.

* * * * *